United States Patent
Takemoto et al.

(10) Patent No.: US 6,667,626 B2
(45) Date of Patent: Dec. 23, 2003

(54) PROBE CARD, AND TESTING APPARATUS HAVING THE SAME

(75) Inventors: Megumi Takemoto, Tokyo (JP); Shigeki Maekawa, Tokyo (JP); Yoshihiro Kashiba, Tokyo (JP); Yuetsu Watanabe, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 109 days.

(21) Appl. No.: 10/080,582

(22) Filed: Feb. 25, 2002

(65) Prior Publication Data

US 2003/0160624 A1 Aug. 28, 2003

(51) Int. Cl.$^7$ ................................. G01R 31/02
(52) U.S. Cl. ........................ 324/754; 324/757
(58) Field of Search .................. 324/754, 762, 324/755, 758, 760, 765, 158.1; 439/482, 824; 174/68.1, 36; 333/240, 248, 247, 84

(56) References Cited

U.S. PATENT DOCUMENTS 6,075,376 A * 6/2000 Schwindt .................... 324/762
6,559,668 B1 * 5/2003 Tervo et al. ................. 324/762

FOREIGN PATENT DOCUMENTS

JP 06-018560 1/1994
JP 11-148947 6/1999

OTHER PUBLICATIONS

U.S. Ser. No. 09/810,247, filed on Mar. 19, 2001, inventors Megumi Takemoto, et al.

* cited by examiner

Primary Examiner—Kamand Cuneo
Assistant Examiner—Trung Nguyen
(74) Attorney, Agent, or Firm—Burns, Doane, Swecker & Mathis, LLP

(57) ABSTRACT

Multiple probe needles are arranged to be brought into contact with one electrode pad with a probe card, the multiple probe needles are connected in parallel with the same potential, and configured so that the amount of current flowing through the probe needles is at least halved, thereby decreasing generation of heat from Joule heat, and preventing melting of aluminum of which the electrode pads are composed. Consequently, a probe card can be provided wherein adhesion of molten material to the probe needles is suppressed, and wherein increased contact resistance due to oxidization of the material which has melted and adhered is prevented.

4 Claims, 5 Drawing Sheets

PROBE CARD, AND TESTING APPARATUS HAVING THE SAME

BACKGROUND OF THE INVENTION

1. Field of the Invention

The present invention relates to a probe card for performing electrical properties confirmation tests (wafer test) for semiconductor integrated circuits, display tests for display devices, operation test for electronic circuit boards, and other such test for semiconductor integrated circuits, and for performing circuit adjustments. The present invention also relates to a test apparatus having the probe card.

2. Description of the Related Art

Conventionally, in the field of semiconductor manufacturing, electrical operation testing of multiple circuit devices in a semiconductor wafer state is performed using measurement equipment called a probe card. FIG. 7 is a plan view illustrating a conventional probe card. With conventional probe cards, electrode pads 12 are disposed at set intervals on the perimeter of the upper face of circuit devices 11 (semiconductor integrated circuits) which are unit blocks of a semiconductor wafer, and multiple probe needles 1 through 10 of the probe card are arrayed such that the tops thereof come into contact with each of the electrode pads 12. Further, the probe card comprises a circuit board 101 with the center portion thereof opened, with the rear ends of the multiple probe needles 1 through 10 to come into contact with the electrode pads 12 of the circuit device 11 attached thereto. A testing apparatus (not shown) is connected to the probe card, so that the test results can be recorded, displayed, etc. Also, arrangements are made wherein a metal resistor is provided in the circuit device 11 beforehand, and an electrical current is applied from the probe card so as to melt the metal resistor and change the resistance value thereof, or wherein a redundant circuit is provided in the circuit device 11 beforehand with a diode, and voltage is applied from the probe card to cause a short-out and make a detour to adjust the semiconductor integrated circuit.

With such probe cards, performing tests by bringing the probe needles 1 through 10 into contact with the electrode pads 12 of the semiconductor integrated circuit may meet instances wherein an insulating film (oxidized film) exists between the electrode pads 12 and the probe needles 1 through 10, which raises the contact resistance, leading to the problem of erroneous measurements. This problem is being dealt with by pressing the probe needles against the electrode pads so as to break through the oxidized film on the surface of the electrode pad and realize contact with a newly-formed surface, but this causes a problem in that the oxidized film that has been scraped off accumulates between the electrode pads 12 and the probe needles 1 through 10, so prolonged use is not possible.

An example of a probe guard for solving the above problems, invented by the present assignee, is disclosed in Japanese Unexamined Patent Application Publication No. 11-148947. This takes advantage of the fact that the electrode pads 12 exhibit shearing deformation only in a particular crystal orientation at the time of pressing the probe needles against the electrode pads 12 of the circuit device 11, such that causing shearing deformation always keeps a newly-formed surface of the electrode pads in contact with the tips of the probe needles, so that testing can be performed for prolonged periods in a stable manner, without raising contact resistance. This probe needle takes into consideration the angle of contact between the probe needle and electrode pad to effect the shearing deformation, so the shape of the tip of the probe needle has been changed from the conventional flat form to a spherical form, and the radius of curvature r of the surface of the spherical form is set with regard to the thickness t of the electrode pad such that the expression $9t \leq r \leq 35t$ holds.

Also, FIG. 8 is a cross-sectional diagram illustrating another conventional probe card disclosed in Japanese Unexamined Patent Application Publication No. 6-18560. This probe card has the rear end of a probe needle 1 which comes into contact with an electrode pad 12 on the surface of a circuit device 11 attached to a circuit board 101, with the probe needle 1 further provided with an ultrasonic vibrator 21, coil 22, and ultrasonic oscillator 23, so as to break through the oxidized film by applying vibrations to the probe needle 1 and thus secure stable electrical contact.

Also, maintenance processing has been performed for scrubbing (sliding sideways on the electrode faces on the semiconductor integrated circuit) adhered aluminum in a state of being mechanically engaged with the tip of the probe needle 1 so as to eliminate the adhered aluminum.

However, with the above-described conventional probe card, in the event of applying a great current, such as 1 A or greater, the electrical resistance between the probe needle 1 and the electronic pad 12 is great at the plane of contact, so there has been the problem of heat thereat. For example, in the event that the tip of the probe needle 1 oxidizes and the contact resistance at the electrode pad reaches several ohms or more, the temperature reaches or exceeds the melting point of aluminum (approximately 660° C.), of which the electrode pad 12 is composed, due to the Joule heat thereat, so the aluminum melts and adheres to the tip of the probe needle 1. The aluminum which has adhered by the above-described melting cannot be eliminated by ultrasonic vibration or scrubbing processing, and once the melding and adhesions of aluminum occurs, the surface thereof oxidizes and the contact resistance thereof becomes high, to the extend that heat is readily generated a current values under 1 A as well. Repeating such testing unavoidably results in accumulation of aluminum on the tip of the probe needle, to the point that finally all conductivity is lost.

Also, attempts to reduce the contact resistance and suppress generation of heat by applying a weight load to the probe needle 1 so as to secure area of contact with the electrode pad 12, but this resulted in a problem in that cracks occur in the circuit device 11 due to the load in the event that the tip form of the probe needle 1 changes due to adhesion of aluminum in particular.

Also, in the event that the area of contact becomes to great due to increasing the diameter of the tip of the probe needle 1, the heat generated can be decreased, but the contact resistance becomes great after repeated tests, leading to the problem of accelerated increase in the amount of heat generated, causing the problem of melting and adhesion of aluminum.

SUMMARY OF THE INVENTION

The present invention has been made to solve the above problems, and accordingly, it is an object thereof to provide a probe card capable of suppressing adhesion of melded material to the probe needle while recovering from increasing in contact resistance due to oxidation of molten adhered material, and a testing apparatus using the same.

The probe card according to a first aspect of the present invention comprises: a circuit board for sending and receiving electrical signals to test the operation of semiconductor integrated circuits; and a plurality of probe needles with one end connected to the circuit board and the other end coming into contact with electrodes connected to the semiconductor integrated circuit; wherein at least two of the probe needles are of the same potential at the time of testing the semiconductor integrated circuit, and wherein the probe needles of the same potential are situated at the same electrode on the semiconductor integrated circuit.

The tip of the probe needles may be of a generally spherical shape.

The probe card according to a second aspect of the present invention comprises: a circuit board for sending and receiving electrical signals to test the operation of semiconductor integrated circuits; a probe needle with one end connected to the circuit board and the other end coming into contact with electrodes connected to the semiconductor integrated circuit; and a circuit for applying voltage to the probe needle to destroy insulating film at the tip of the probe needle.

Also, a testing apparatus for semiconductor integrated circuits may comprise one of the probe cards according to the first or second aspects.

DESCRIPTION OF THE PREFERRED EMBODIMENTS

First Embodiment

Figure 1:
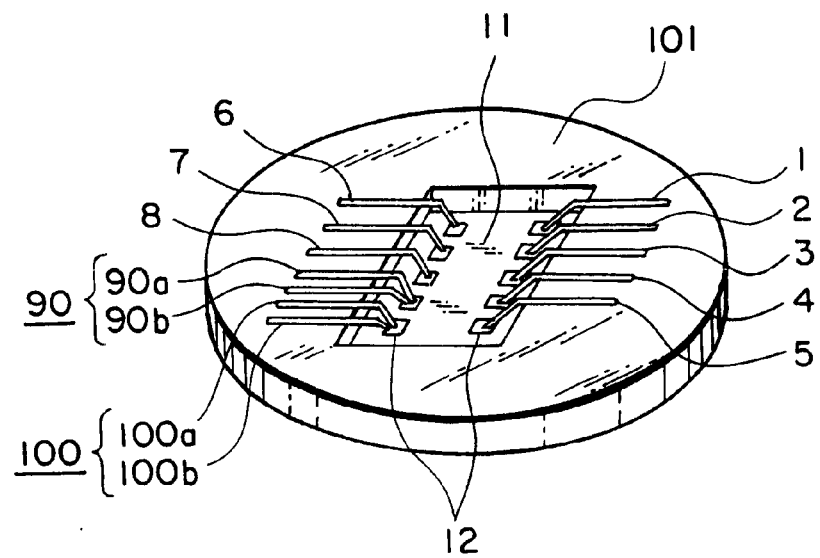
FIG. 1 is a perspective view of a probe card according to a first embodiment of the present invention.
Figure 2:
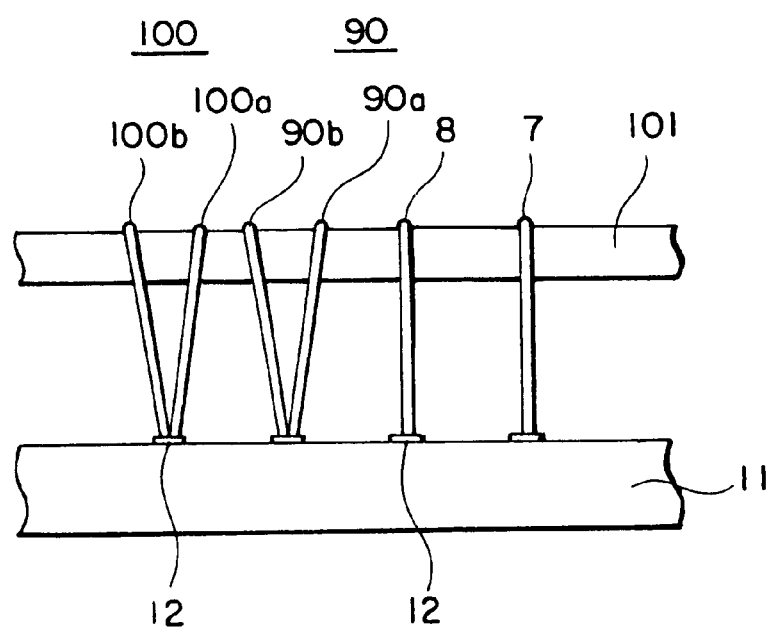
FIG. 2 is a cross-sectional view illustrating the contact state between a probe needle and electrode pad of a semiconductor integrated circuit according to the first embodiment of the present invention.

The following is a description of an embodiment of the present invention, with reference to the drawings. FIG. 1 is a perspective view of a probe card according to a first embodiment of the present invention, and FIG. 2 is a cross-sectional view illustrating the contact state between a probe needle and electrode pad of a semiconductor integrated circuit. In the figures, reference numerals 1 through 8, 90*a*, 90*b*, 100*a*, and 100*b* denote probe needles (with flat tips), 90 and 100 denote twin probe needles, 11 denotes a circuit device, 12 denotes electrode pads, and 101 denotes a circuit board.

With this probe card, the probe needles 1 through 8 come into respective contact with electrodes 12 provided on the circuit device 11 of the semiconductor integrated circuit, one each. On the other hand, 90 and 100 are twin probe needles each made up of two probe needles 90*a* and 90*b*, and 100*a* and 100*b*, wherein each come into contact with one electrode pad 12 and each are connected in parallel with a circuit (not shown) of the circuit board 101, with the same potential. Accordingly, the current flowing through the probe needles 90*a*, 90*b*, 100*a*, and 100*b*, making up the twin probe needles 90 and 100, is halved, so the amount of heat generation due to Joule heat can be reduced, and melting of aluminum which is the component of the electrode pads 12 can be prevented.

The following experiment was carried out to confirm the effects of the twin probe needles 90 and 100 according to the present embodiment. First, only one of the twin probe needles, the probe needle 90*a*, composed of tungsten, as brought into contact with an electrode pad 12, and a current of approximately 1 A was applied for around 100 μs. As a result, heat was generated and the aluminum making up the electrode pad 12 melted, with the aluminum reacting with the tungsten surface. Next, the twin probe 90 was brought into contact with the electrode pad 12, and a current of approximately 1 A was applied for around 100 μs, in the same manner. As a result, there was no melting of the electrode pad 12, and performing contact again still did not exhibit any adhesion of aluminum, so stable testing could be performed without increase in contact resistant.

Continued testing showed that the contact resistance of one of the twin probe needles 90, the probe needle 90*a*, became somewhat higher, but the current flows to the other probe needle 90*b*, so continued suppression of heat generation was thus confirmed.

Also, though there was adhesion of aluminum and aluminum oxides on one of the twin probe needles 90, the probe needle 90*a*, this was not adhesion due to melting, so repeatedly performing further tests recovered the contact resistance by the scrubbing from contact with the electrode pads 12, to where a state near that of the initial state was achieved.

Figure 7:
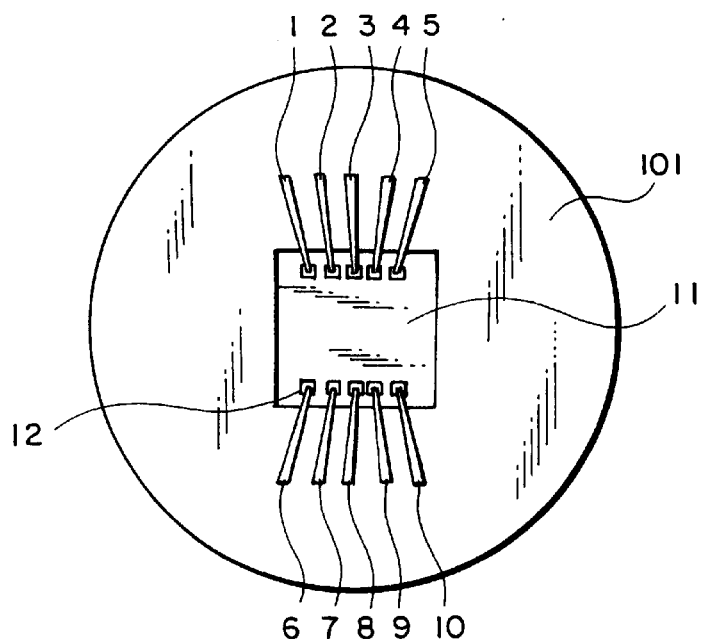
FIG. 7 is a plan view illustrating a conventional probe card.
Figure 8:
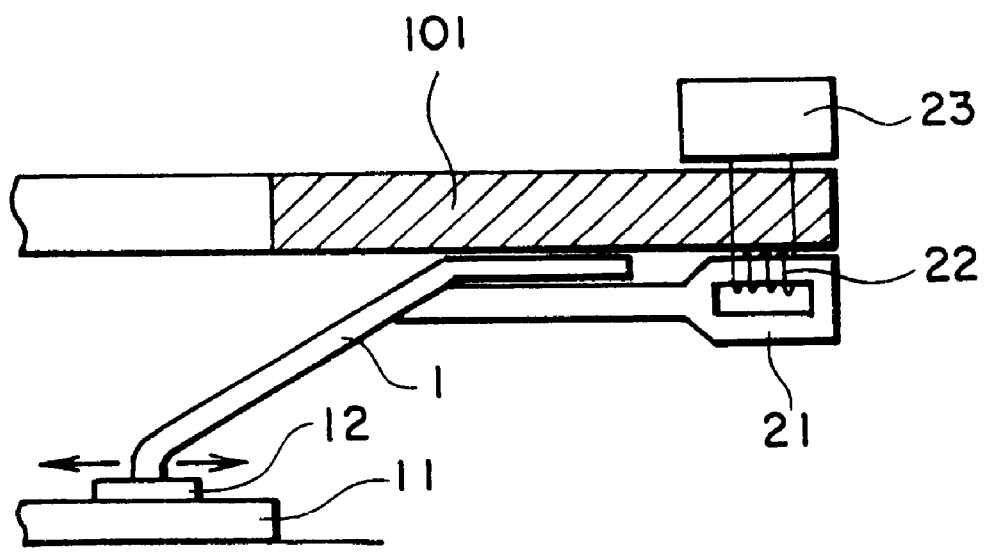
FIG. 8 is a cross-sectional view illustrating a conventional probe card.

Next, semiconductor integrated circuit testing requiring a great current was performed using the probe card according to the embodiment having the twin probe needles 90 and 100, and the conventional probe card shown in FIG. 7 (having flat probe needle tips) wherein the contact resistance and number of times of testing (contact) were compared. The conventional probe card and the probe card according to the present embodiment have a circuit design such that a current of 1 A is applied for around 100 μs to the probe needles 9 and 10 of the conventional probe card and to the probe needles 90 and 100 of the probe card according to the present embodiment (there is no applying of a great current to the probe needles 1 through 8). Aluminum melts with the probe needles 9 and 10 of the conventional probe card, so the contact resistance reached several ohms after just a few contacts, and following several tens of contacts, the circuit was open. On the other hand, with the twin probe needles 90 and 100 of the probe card according to the present embodiment, melting of aluminum is suppressed, so contact resistance of 1 Ω or lower was kept even after several hundred contacts. Also, the testing was further continued for another several hundred contacts, and it was confirmed that the circuit was not open.

Now, though the present embodiments has been described with reference to an example wherein two probe needles of a twin probe have the same potential, the number of probe needles may be three, or more.

Second Embodiment

Figure 3:
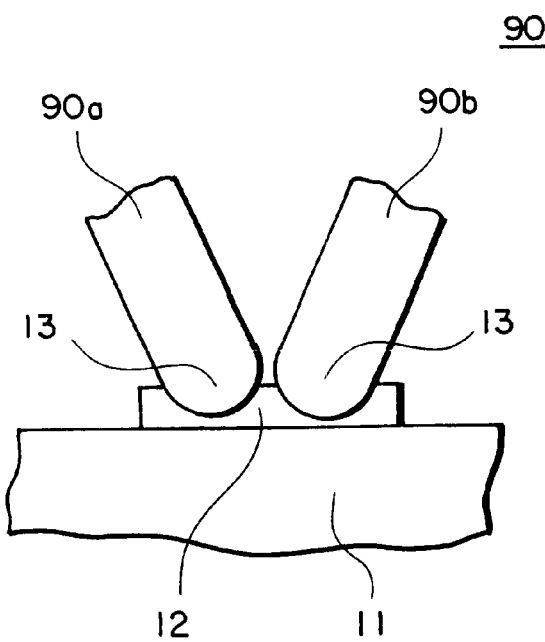
FIG. 3 is a cross-sectional view illustrating the contact state between a probe needle and electrode pad of a semiconductor integrated circuit according to a second embodiment of the present invention.

FIG. 3 is a cross-sectional view illustrating the contact state between the probe needles and electrode pad of a semiconductor integrated circuit, according to the second embodiment of the present invention. In the figure, reference numeral 90 denotes a twin probe needle, 90a and 90b denote probe needles, 11 denotes a circuit device, 12 denotes electrode pads, and 13 denotes the tip.

With this probe card, the probe needles 90a and 90b make up a twin probe needle 90 wherein the probe needles 90a and 90b each have the same potential, coming into contact one electrode 12 provided on the circuit device 11. Further the tips 13 thereof are spherical. Accordingly, generation of heat can be suppressed in the same manner as with the above first embodiment, and also shearing deformation of the electrode pad 12 can be realized to cause constant contact between a newly generated surface of the electrode pad 12 and the probe needles. Further, with the present embodiment, in the event that a great current is applied, the temperature of the aluminum of the electrode pad rises and readily undergoes plastic deformation, and thus is deformed, but the shape of the tips 13 of the twin probe needles are spherical in shape, such that the tips 13 of the probe needles sink into the electrode pad 12 which increases the area of contact, which in turn lowers the contact resistance, further suppressing generation of heat.

The tips 13 of the twin probes 90a and 90b according to the present embodiment were formed in a spherical shape with a curvature radius of around 15 μm, and evaluation was performed in the same manner as that described in the first embodiment. That is, semiconductor integrated circuit testing requiring a great current was performed using the probe card according to the present embodiment having the twin probe needle 90 with spherical tips, and the conventional probe card shown in FIG. 7 (having spherical probe needle tips), wherein the contact resistance and number of times of testing (contact) were compared. The conventional probe card and the probe card according to the present embodiment have a circuit design such that a current of 1 A is applied for around 100 μs to the probe needle 9 with a spherical tip and to the probe needles 90 of the probe card according to the present embodiment. With the probe needle 9 of the conventional probe card, the tip was spherical so the number of times of contact improves over cases of using flat-tipped probe needles as shown in the first embodiment, but still the aluminum melts, and the contact resistance rose after around 200 contacts. Comparatively, with the twin probe needles 90 of the probe card according to the present embodiment, the tips are spherical so the contact resistance was even smaller, melting of aluminum was suppressed, and contact resistance of 1 Ω or lower was kept even after around 1000 contacts. Also, the testing was further continued for another 500 contacts, and it was confirmed that the circuit was not open. Accordingly, the lifetime (number of contacts) of the probe card having the twin probes according to the first embodiment, was doubled.

Also, the tips are spherical and accordingly area of contact can be secured, so contact resistance of around 1 Ω or less could be secured after around 1000 contacts in the same manner as described above even when the current was increased to around 1.5 A.

Third Embodiment

Figure 4:
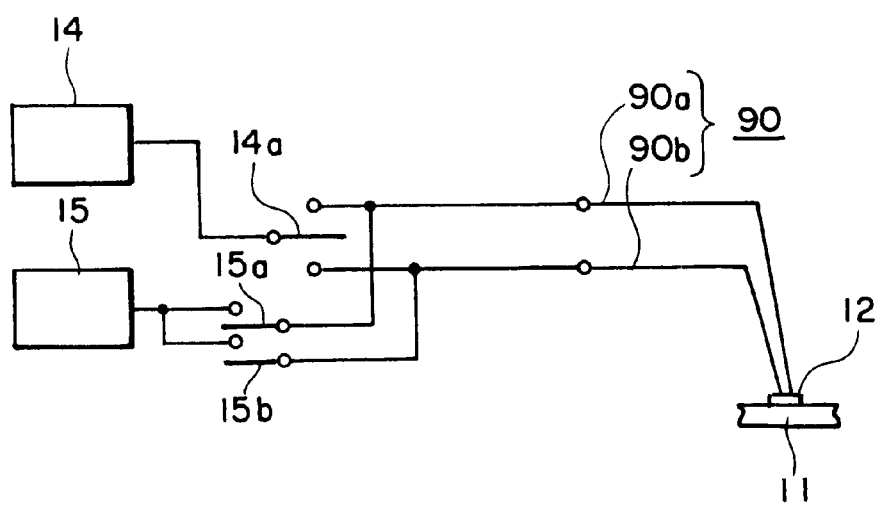
FIG. 4 is a configuration diagram of a testing apparatus for testing semiconductor integrated circuits, according to a third embodiment of the present invention.
Figure 5:
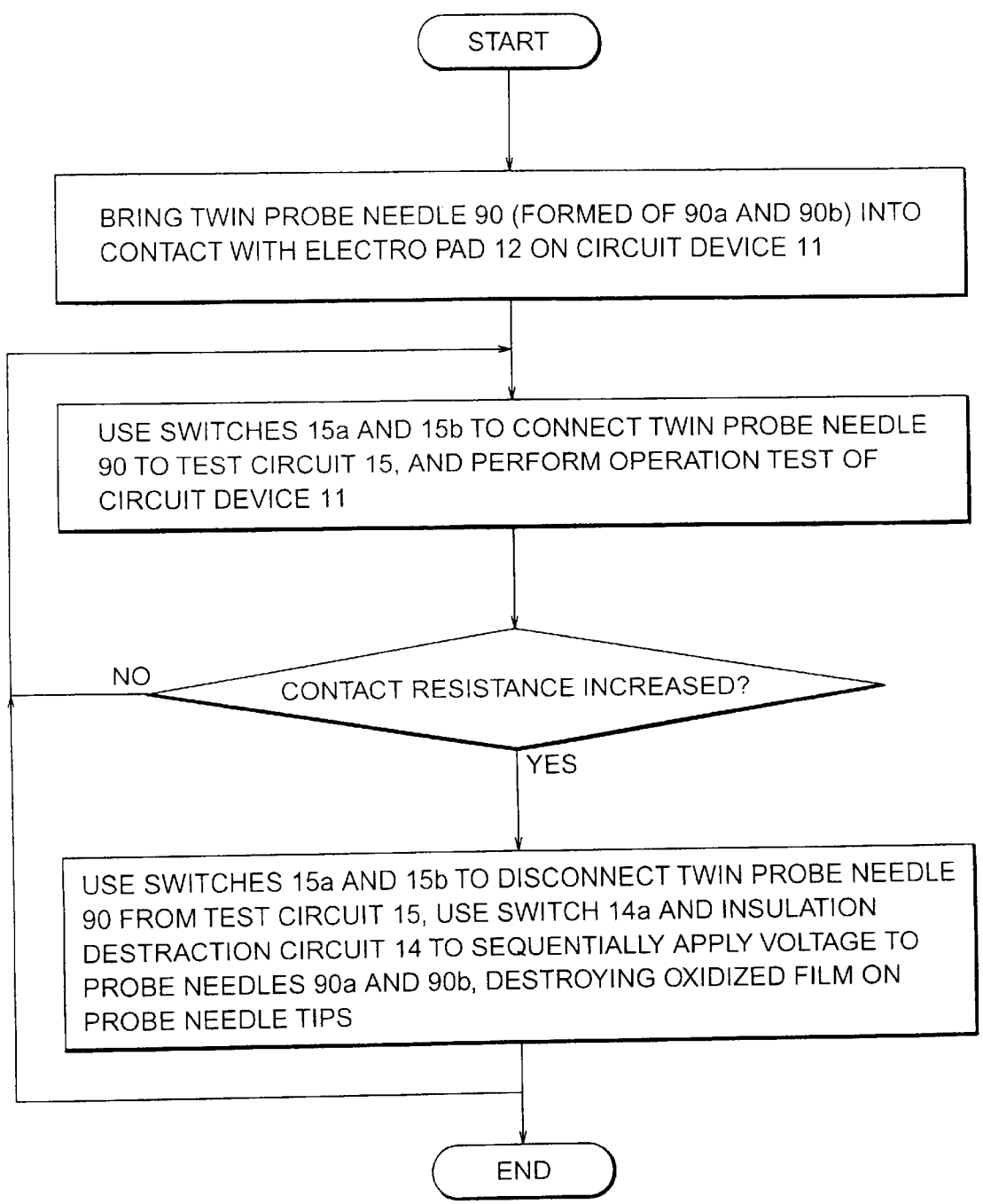
FIG. 5 is a flowchart illustrating the test method of semiconductor integrated circuits according to a third embodiment of the present invention.

FIG. 4 is a configuration diagram of a testing apparatus for testing semiconductor integrated circuits according to the third embodiment of the present invention, and FIG. 5 is a flowchart illustrating the test method of semiconductor integrated circuits according to the third embodiment of the present invention. In the figures, reference numeral 11 denotes a circuit device, 12 denotes electrode pads, 14 denotes an insulation destruction circuit, 15 denotes a testing circuit for testing semiconductor integrated circuits, 14a and 15a denote switches, 90 denotes a twin probe needle, and 90a and 90b denote probe needles.

With this testing apparatus, the twin probe needle 90 is brought into contact with the electrode pad 12 on the circuit device 11, is not connected to the switch 14a connected to the insulation destruction circuit 14 but is connected to the testing circuit 15 using the switches 15a and 15b, and the circuit device 11 is tested. Continuing this testing results in the contact resistance eventually increasing as the number of times of contact increases. At the point that the contact resistance reaches or exceeds 1 Ω for example, the testing is interrupted, the switches 15a and 15b are turned off, the insulation destruction circuit 14 and the probe needles 90a and 90b are sequentially connected using the switch 14a, and voltage of around 5 V is applied to the probe needles one at a time for around 15 msec. This destroys the aluminum oxide film adhering to the tips of the probe needles 90a and 90b, so the contact resistance can be reduced again. Accordingly, the twin probe needle 90 with recovered contact resistance can be connected to the testing circuit 15 again, and testing can be continued.

This testing apparatus allows testing of semiconductor integrated circuits to be carried out for long times without maintenance such as exchanging probe needles or scrubbing, even in the event that aluminum adheres to the tops of the probe needles 90a and 90b to form aluminum oxide. Specifically, it has been confirmed that with the testing apparatus according to the present embodiment using the probe card described in the first embodiment, even after the contact resistance increased after 1000 contacts, testing could be performed for around another 2000 contacts.

Fourth Embodiment

Figure 6:
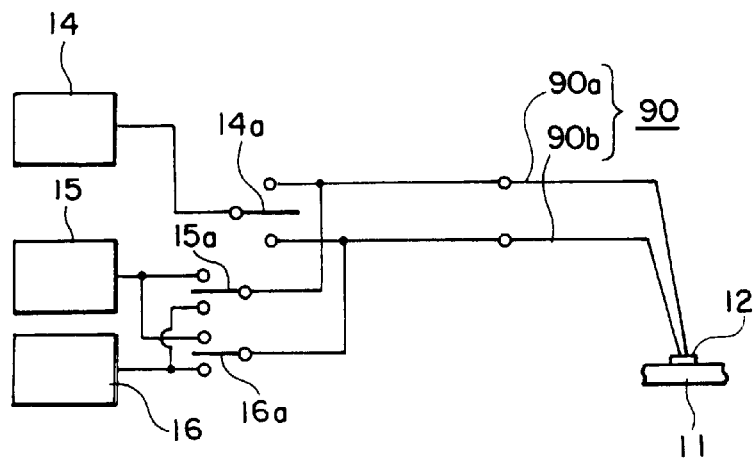
FIG. 6 is a configuration diagram of a testing apparatus for testing semiconductor integrated circuits, according to a fourth embodiment of the present invention.

FIG. 6 is a configuration diagram of a testing apparatus for testing semiconductor integrated circuits, according to the fourth embodiment of the present invention. In the figure, reference numeral 11 denotes a circuit device provided with a resistor or redundant circuit (not shown) beforehand, 12 denotes electrode pads, 14 denotes an insulation destruction circuit, 15 denotes a testing circuit for testing semiconductor integrated circuits, 16 denotes a circuit for adjusting semiconductor integrated circuits, 14a through 16a denote switches, 90 denotes a twin probe needle, and 90a and 90b denote probe needles.

With this testing apparatus, as with the third embodiment described above, the twin probe needle 90 is brought into contact with the electrode pad 12 on the circuit device 11, is not connected to the switch 14a connected to the insulation destruction circuit 14 but is connected to the testing circuit using the switches 15a and 16a, and the circuit device 11 is tested. In the event that judgment is made during the testing that the circuit of the circuit device 11 needs adjustment, the switches 15a and 16a are switched over for connection to the adjusting circuit 16, and electrical signals are sent to perform adjustment such as changing the resistance value of the resistor within the circuit device 11 or opening the redundant circuit to correct the circuit. Continuing this testing, including circuit adjustment, results in the contact resistance eventually increasing as the number of times of contact increases. At the point that the contact resistance reaches or exceeds 1 Ω, the testing is interrupted, the switches 15a and 16a are turned off, the insulation destruction circuit 14 and the probe needles 90a and 90b are sequentially connected using the switch 14a, and voltage of around 5 V is applied to the probe needles one at a time for around 15 msec. This destroys the aluminum oxide film adhering to the tips of the probe needles 90a and 90b, so the contact resistance can be reduced again.

Now, while the above third and fourth embodiments have been described with reference to examples wherein the insulation destruction circuit 14 is used to destroy oxidized film generated on the tips of the twin probe needles, the number of probe needles provided for each electrode pad is not particularly restricted, and may be three or more, or may be one, as with conventional arrangements.

The present invention is configured as described above, and according exhibits the following advantages. Multiple probe needles are brought into contact with one electrode pad with the probe card, and the multiple probe needles are connected in parallel with the same potential, so that the amount of current flowing through the probe needles is at least halved. Accordingly, generation of heat from Joule heat can be decreased, melting of aluminum making up the electrode pads can be prevented, and consequently highly-reliable testing can be performed for a long time.

Also, forming the tips of the multiple probe needles in generally spherical shapes means that even in the event that the temperature of the electrode pads rises and the electrode pads undergo plastic deformation due to application of a great current, the tips of the probe needles sink into the electrode pads which increases the area of contact between the probe needles and the electrode pad, lowering the contact resistance, and generation of heat can be suppressed.

Also, an insulation destruction circuit which applies voltage to the probe needles to destroy the insulating film at the tips of the probe needles is provided, so recovery can be effected without maintenance such as exchanging probe needles or scrubbing, even in the event that aluminum adheres to the tops of the probe needles and forms aluminum oxide, and adjusting and testing of semiconductor integrated circuits to be carried out for extended periods.

Also, the testing apparatus for adjusting or testing semiconductor integrated circuits comprises a probe card wherein multiple probe needles come into contact with one electrode pad, or a probe card wherein the tips of the multiple probe needles are formed generally spherically, or a probe card wherein an insulation destruction circuit is provided which applies voltage to the probe needles to destroy the insulating film at the tips of the probe needles, so highly reliable testing can be performed for a long time.

What is claimed is:

1. A probe card, comprising:

a circuit board for sending and receiving electrical signals to test the operation of semiconductor integrated circuits; and a plurality of probe needles with one end connected to said circuit board and the other end coming into contact with electrodes connected to said semiconductor integrated circuit;

wherein at least two of said probe needles are of the same potential at the time of testing said semiconductor integrated circuit, and wherein said probe needles of the same potential are situated at the same electrode on said semiconductor integrated circuit.

2. A probe card according to claim 1, wherein the tip of said probe needles is of a generally spherical shape.

3. A testing apparatus for semiconductor integrated circuits, comprising the probe card according to claim 1.

4. A testing apparatus for semiconductor integrated circuits, comprising the probe card according to claim 2.

* * * * *